(12) United States Patent
Chadwick et al.

(10) Patent No.: US 9,099,427 B2
(45) Date of Patent: *Aug. 4, 2015

(54) THERMAL ENERGY DISSIPATION USING BACKSIDE THERMOELECTRIC DEVICES

(71) Applicant: International Business Machines Corporation, Armonk, NY (US)

(72) Inventors: Nathaniel R. Chadwick, Lowell, MA (US); Jeffrey P. Gambino, Westford, VT (US); Kirk D. Peterson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 71 days.

This patent is subject to a terminal disclaimer.

(21) Appl. No.: 14/067,507

(22) Filed: Oct. 30, 2013

(65) Prior Publication Data

US 2015/0115431 A1    Apr. 30, 2015

(51) Int. Cl.
*H01L 23/38* (2006.01)
*H01L 35/34* (2006.01)
*H01L 35/30* (2006.01)

(52) U.S. Cl.
CPC ............ *H01L 23/38* (2013.01); *H01L 35/30* (2013.01); *H01L 35/34* (2013.01); *H01L 2225/06513* (2013.01); *H01L 2225/06541* (2013.01); *H01L 2225/06589* (2013.01)

(58) Field of Classification Search
CPC ............ H01L 2924/0002; H01L 2225/06513; H01L 2225/06541; H01L 2225/06589; H01L 27/16
USPC .................. 136/203, 212, 201, 205; 257/712, 257/E23.101, 23.11, 686, 717, 930; 438/54, 438/55
See application file for complete search history.

(56) References Cited

U.S. PATENT DOCUMENTS

| 5,712,448 | A * | 1/1998 | Vandersande et al. ........ 136/203 |
| 6,410,971 | B1 * | 6/2002 | Otey .............................. 257/467 |
| 7,235,735 | B2 | 6/2007 | Venkatasubramanian et al. |

(Continued)

OTHER PUBLICATIONS

Li et al., "Fabrication of Nanostructured Thermoelectric Bismuth Telluride Thick Films by Electrochemical Deposition", Chem. Mater. 2006, vol. 18, pp. 3627-3633.

(Continued)

*Primary Examiner* — David Vu
*Assistant Examiner* — Jonathan Han
(74) *Attorney, Agent, or Firm* — Thompson Hine LLP; Anthony J. Canale

(57) ABSTRACT

Embodiments of the present invention provide a semiconductor structure and method to dissipate heat generated by semiconductor devices by utilizing backside thermoelectric devices. In certain embodiments, the semiconductor structure comprises an electronic device formed on a first side of the semiconductor structure. The semiconductor structure also comprises a thermoelectric cooling device formed on a second side of the semiconductor structure in close proximity to a region of the semiconductor structure where heat dissipation is desired, wherein the thermoelectric cooling device includes a Peltier junction. In other embodiments, the method comprises forming an electronic device on a first side of a semiconductor structure. The method also comprises forming a thermoelectric cooling device on a second side of the semiconductor structure in close proximity to a region of the semiconductor structure where heat dissipation is desired, wherein the thermoelectric cooling device includes a Peltier junction.

20 Claims, 9 Drawing Sheets

(56) References Cited

U.S. PATENT DOCUMENTS

| | | | |
|---|---|---|---|
| 7,523,617 B2 | 4/2009 | Venkatasubramanian et al. | |
| 7,679,203 B2 | 3/2010 | Bharathan et al. | |
| 7,838,759 B2 | 11/2010 | Alley et al. | |
| 8,030,113 B2 * | 10/2011 | Hsu et al. | 438/55 |
| 2007/0056621 A1 * | 3/2007 | Baskaran | 136/201 |
| 2008/0047598 A1 * | 2/2008 | Lofy | 136/203 |
| 2010/0127299 A1 * | 5/2010 | Smith et al. | 257/99 |
| 2010/0219525 A1 * | 9/2010 | Ibaraki | 257/693 |
| 2012/0153454 A1 | 6/2012 | Liu et al. | |

OTHER PUBLICATIONS

Ikeda et al., "Thermal Performance of Thermoelectric Cooler (TEC) Integrated Heat Sink and Optimizing Structure for Low Acoustic Noise / Power Consumption", 22nd IEEE Semi-Therm Symposium, 2006.

Lim et al., "Thermoelectric Microdevice Fabrication Process and Evaluation at the Jet Propulsion Laboratory (JPL)", 21st International Conference on Thermoelectronics, 2002 IEEE.

Nextreme Thermal Solutions, "The Thermal Copper Pillar Bump: Enabling improved semiconductor performance without sacrificing efficiency", Jan. 9, 2008, Research Triangle Park, NC, US.

Seo et al., "The Electrical, Mechanical Properties of Through-Silicon-Via Insulation Layer for 3D ICs", 2009 International Conference on Electronic Packaging Technology & High Density Packaging (ICEPT—HDP) 978-1-4244-4659/09, Copyright 2009 IEEE.

Snyder et al., "Complex thermoelctric materials", Nature Publishing Group, vol. 7, Feb. 2008, <www.nature.com/naturematerials>.

Stark et al., "New Micro Thermoelectric Devices on Bismuth Telluride-Type Thin Solid Films", 18th International Conference on Thermoelectrics, 2000 IEEE.

* cited by examiner

THERMAL ENERGY DISSIPATION USING BACKSIDE THERMOELECTRIC DEVICES

BACKGROUND

The present disclosure relates generally to a design structure, and more specifically to a design structure for dissipating thermal energy generated by semiconductor devices utilizing backside thermoelectric devices.

The cooling of integrated circuits becomes increasingly difficult with scaling, as there are more devices per unit area per die. There are a variety of cooling solutions, for example, servers may be cooled by using large metal heat sinks, fins, and water cooling. However, for portable devices, a small form-factor cooling device is desirable. One solution involves thermoelectric cooling (hereinafter "TEC"), which uses the Peltier effect to create a heat flux between the junction of two different types of thermoelectric materials. TEC devices are solid-state active heat pumps which transfer heat from one side of the device to the other.

Thermoelectric devices formed from semiconductor thermoelectric materials do not need any liquid or gas as coolant and have the advantages of continuous work capabilities, no pollution, no moving parts, no noise, long life, small volume and light weight. However, traditional thermoelectric devices have a large volume and require a separate power supply circuit. As such, they can only be attached to an outside of 3D stacked integrated circuits, which may have issues with effectively cooling the interior high temperature areas.

SUMMARY

Embodiments of the present invention provide a semiconductor structure and method to dissipate heat generated by semiconductor devices by utilizing backside thermoelectric devices. In certain embodiments, the semiconductor structure comprises an electronic device formed on a first side of the semiconductor structure. The semiconductor structure also comprises a thermoelectric cooling device formed on a second side of the semiconductor structure in close proximity to a region of the semiconductor structure where heat dissipation is desired, wherein the thermoelectric cooling device includes a Peltier junction. In other embodiments, the method comprises forming an electronic device on a first side of a semiconductor structure. The method also comprises forming a thermoelectric cooling device on a second side of the semiconductor structure in close proximity to a region of the semiconductor structure where heat dissipation is desired, wherein the thermoelectric cooling device includes a Peltier junction.

DETAILED DESCRIPTION

Figure 1:
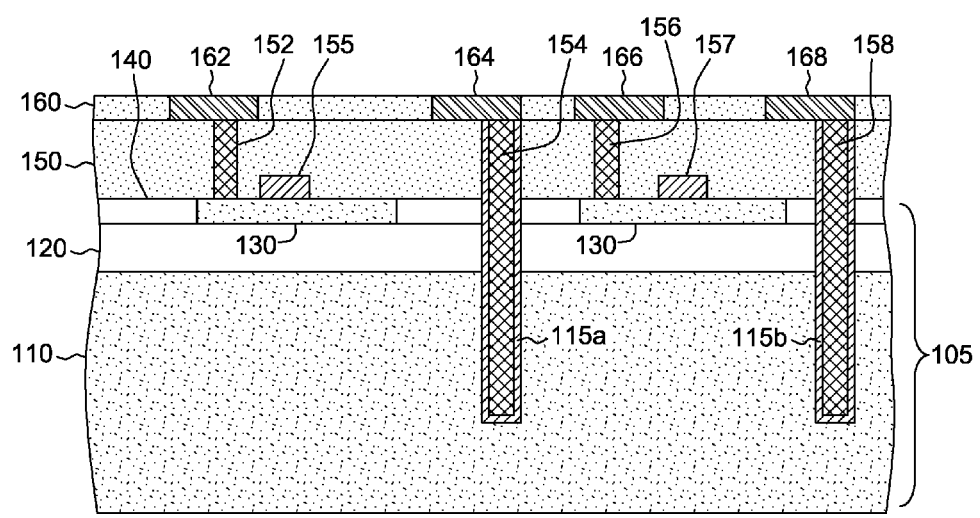
FIG. 1 depicts fabrication steps, in accordance with an embodiment of the present invention.
Figure 2:
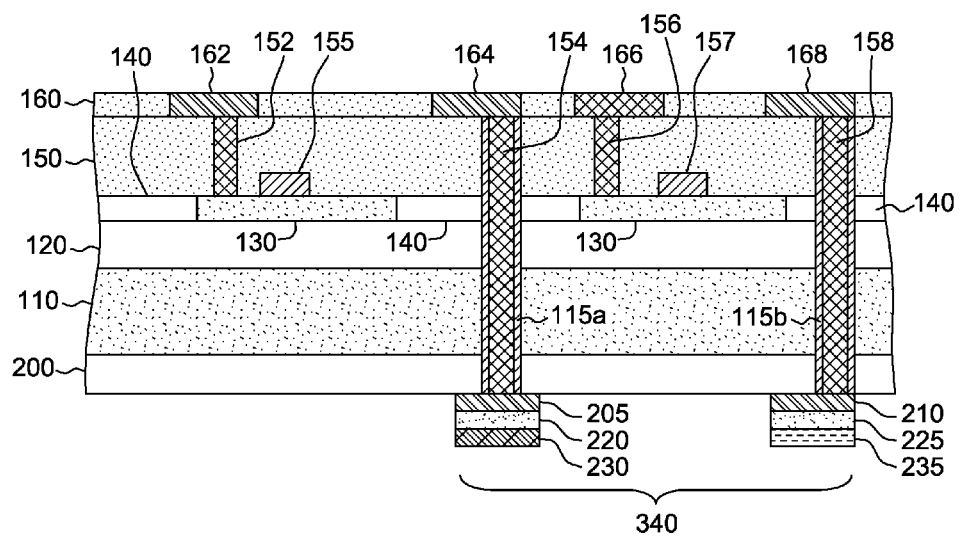
FIG. 2 depicts additional fabrication steps, in accordance with an embodiment of the present invention.
Figure 3:
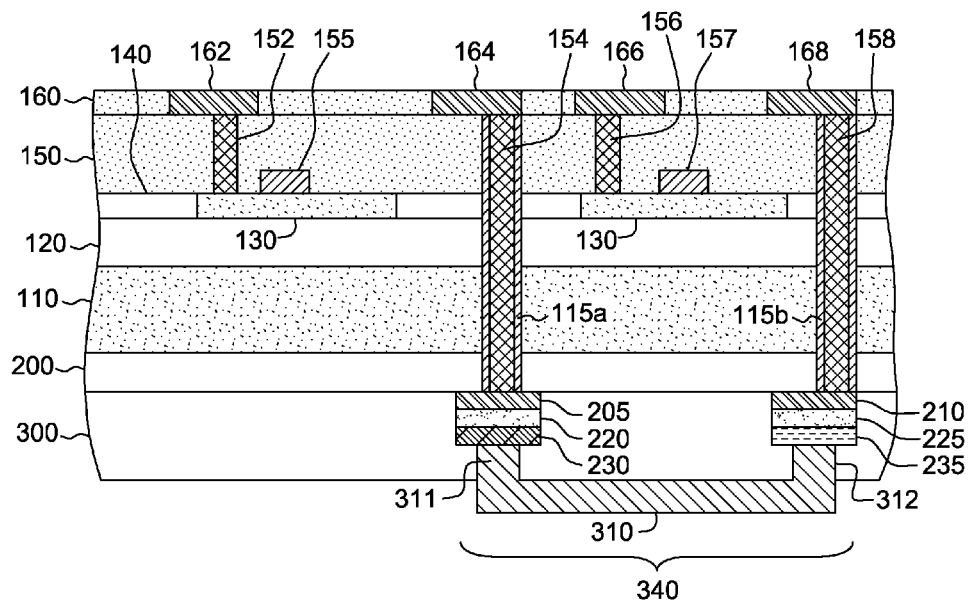
FIG. 3 depicts additional fabrication steps, in accordance with an embodiment of the present invention.

FIGS. 1-3 illustrate the steps for fabricating an integrated circuit having embedded thermoelectric cooling (hereinafter "TEC") devices. FIG. 1 depicts fabrication steps, in accordance with an embodiment of the present invention. Wafer 105 is a semiconductor wafer that includes layers 110, 120, and 130. In an embodiment, wafer 105 is a silicon on insulator (hereinafter "SOI") wafer. Layers 110 and/or 130 include semiconductor material, such as silicon, germanium, and gallium arsenide. In another embodiment, layer 120 is a buried dielectric layer, such as silicon oxide. In certain embodiments, layer 130 is a device layer. In other embodiments, layer 110 is a handle wafer. Although a SOI wafer is used, bulk semiconductor substrates may be used in place of SOI substrates. In certain embodiments, dielectric material, insulating material, and/or conductive material is deposited using an appropriate deposition process, for example, physical vapor deposition, chemical deposition, electrochemical deposition, molecular beam epitaxy, and atomic layer deposition. Likewise, conductive material can be deposited using an appropriate deposition process, such as sputtering.

Trenches 140, which are shallow trench isolations, are etched in to layer 130, for example, by wet and/or dry etching. In certain embodiments, dielectric material is deposited in trenches 140. The excess dielectric is removed by mechanical and chemical planarization.

In an embodiment, layer 150 includes dielectric material deposited using an appropriate deposition process, such as CVD. A gate oxide is grown by thermo oxidation, poly silicon is deposited by CVD, and a resist mask is formed on top of the polysilicon. Transistors 155 and 157 are patterned by an appropriate process, such as reactive ion etching. Spacers are formed on the gates by CVD and reactive ion etching. Transistors 155 and 157 are formed using appropriate processes, such as ion implantation, annealing, and silicide implantation. Layer 150 is deposited on layer 130 and trenches 140, for example, by CVD. In an embodiment, layer 150 is silicon oxide. Layer 150 is then planarized to remove excess material. A mask is applied and reactive ion etching is applied to etch contacts 152 and 156. Metal is deposited in contacts 152 and 156 with the excess removed by CMP. TSV 154 and 158 are formed using appropriate processes, such as lithography and etching. A predefined lithography pattern is applied to non TSV areas of layer 150 and TSV 154 and 158 are etched. Dielectric material is deposited to form barriers 115a and 115b. Metal is subsequently deposited to form TSVs 154 and 158 with the excess removed, for example by CMP.

Layer 160, which includes dielectric material, is formed on layer 150, for example, by CVD. A resist is formed on non-trench areas of layer 160 and trenches are formed therein, for example, by etching. The resist is subsequently removed. Metal is deposited in the trenches forming metal contacts 162, 164, 166, and 168. The excess metal from metal contacts 162, 164, 166, and 168 is removed, for example, by CMP. FIG. 2 illustrates additional fabrication steps, in accordance with an embodiment of the present invention. Layer 110 is thinned to expose TSVs 154 and 158. In an embodiment, an additional silicon etch is performed to ensure that the TSVs 154 and 158 protrude from layer 110. Layer 200, which includes dielectric material, is deposited on layer 110, for example, by CVD. In an embodiment, layer 200 includes polyimide, silicon oxide, and SiN. Layer 200 is planarized by CMP to expose the TSVs 154 and 158. In an embodiment, bond pads 205 and 210, which include conductive material, such as barium and copper, are formed on layer 200 by first depositing a titanium barrier layer and/or copper seed layer on to layer 200, for example, by sputter deposition. Resist is formed on non-TEC areas of layer 200 and solder is plated to form metal contacts 220 and 225. The resist is then removed, for example, by an oxygen plasma or solvent, and the barrier and/or seed layer is etched by wet etching. In an embodiment, metal contacts 220 and 225 also include additives, such as copper and/or silver. Subsequently, the resist is removed.

Thermoelectric cooling (hereinafter "TEC") devices are non-mechanical cooling devices that attract heat when an electric current is applied to it. TEC devices use the Peltier effect to create a heat flux between the junction of n-type and p-type semiconductor materials. TEC devices can be constructed by placing the dielectric material in parallel thermally and in series electrically. TEC elements 230 and 235 are attached to bond pads 205 and 210 by metal contacts 220 and 225, respectively. In an embodiment, TEC elements 230 and 235 are grown on a separate substrate, such as gallium arsenide, and are then attached to bond pads 205 and 210, for example, by solder reflow. In other embodiments, bond pads 205 and 210 may be formed on TEC elements 230 and 235 to improve adhesion to metal contacts 220 and 225

TEC elements 230 and 235 include n-type and/or p-type TEC material, such as bismuth telluride, lead telluride, cobalt triantimonide, and silicon germanium. TEC elements 230 and 235 include TEC materials that have dissimilar electron concentrations. For example, if TEC element 230 includes an n-type TEC material, then TEC element 235 includes a p-type TEC material and vice-versa.

FIG. 3 depicts additional fabrication steps, in accordance with an embodiment of the present invention. Another mask is formed on the non-wire areas of layer 300 and vias 311 and 312 are patterned therein using, for example, conventional lithography and etching. The mask is removed. Wire 310, which includes conducting material, such as TiN/Al, is formed on TEC elements 235 and 230 and wire portions of layer 300, for example, by sputter deposition or electroplating.

TEC device 340 is energized via metal contacts 164 and 168 and TSVs 154 and 158. When energized, heat is drawn towards TEC elements 230 and 235 and dissipates in to layer 300. FIG. 3 illustrates a multi-layered semiconductor device that includes electronic devices formed on a side of the semiconductor device, in accordance with an embodiment of the present invention. Wherein the semiconductor device is formed on a SOI wafer and cooled via a TEC device that is affixed to the opposite side of the SOI wafer that the electronic devices are formed on. The TEC device is affixed to the semiconductor device via solder bumps and, in response to being energized via TSVs that are connected to metal contacts, attracts heat generated by the electronic devices.

Figure 4:
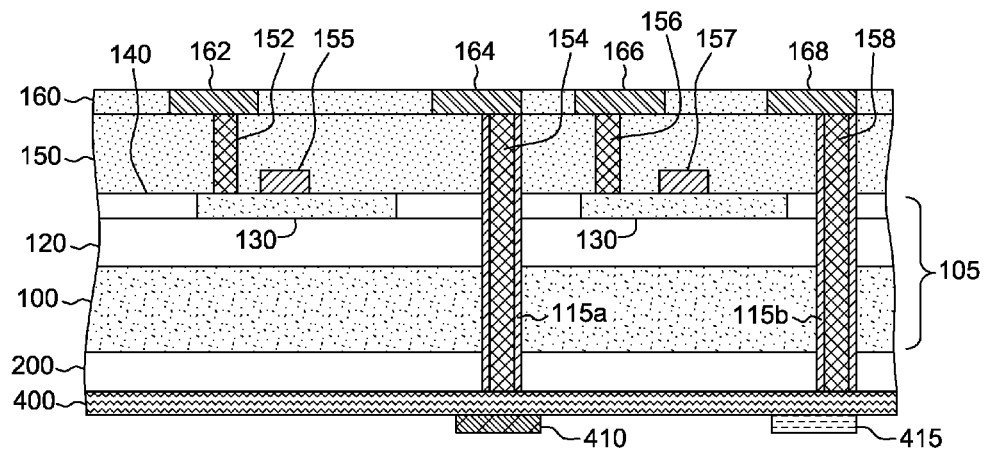
FIG. 4 depicts additional fabrication steps, in accordance with an embodiment of the present invention.
Figure 5:
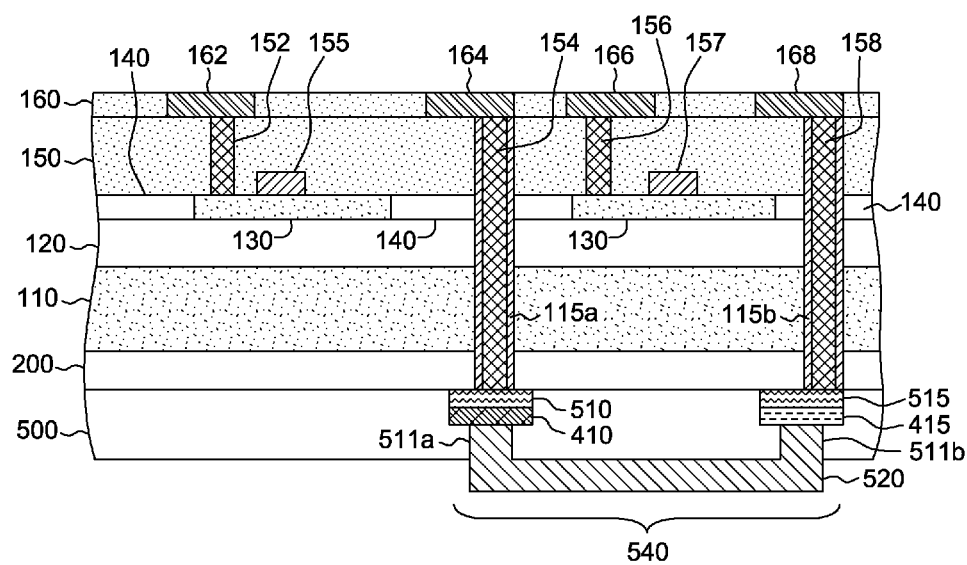
FIG. 5 depicts additional fabrication steps, in accordance with an embodiment of the present invention.

FIGS. 4 and 5 depict fabrication steps for additional embodiments of the present invention wherein the TEC device connects to the wafer via metal contacts instead of solder bumps. FIG. 4 depicts additional fabrication steps, in accordance with embodiments of the present invention. FIG. 4 uses the fabrication steps depicted in FIG. 1; however, instead of forming metal contacts 205 and 210 on layers 200, layer 400, which is a metal layer that includes conducting material, is formed on layer 200. In an embodiment, layer 400 includes titanium and/or copper. In an embodiment, layer 400 is a bond pad layer. A mask is formed on the first non-TEC area of layer 400 and TEC element 410 is formed on layer 400, for example, by electroplating. Subsequently, the mask is removed. Another mask (not shown) is formed on the second non-TEC area of layer 400 and TEC element 415, which include TEC material, is formed on layer 400. TEC elements 410 and 415 function similarly to TEC elements 230 and 235 (discussed above), respectively. TEC elements 410 and 415 also include the same TEC material as TEC elements 230 and 235 (discussed above).

FIG. 5 depicts additional fabrication steps, in accordance with an embodiment of the present invention. Non-TEC areas of layer 400 are removed using an appropriate process, such as wet etching, which results in contacts 510 and 515. Layer 500, which includes insulator material, is formed on layer 200. Vias 511a and 511b are formed in layer 500 in the same fashion as vias 311 and 312, respectively, are formed in layer 300. Wire 520 is formed in the same fashion as wire 310 (discussed above). TEC device 540 functions in the same fashion as TEC device 340. In addition, wire 520 function is a similar fashion to wire 310. FIG. 5 illustrates a multi-layered semiconductor device that includes electronic devices formed on a side of structure, in accordance with an embodiment of the present invention. Wherein the semiconductor device, which is formed on a SOI wafer, is cooled via a TEC device that is affixed to the opposite side of the semiconductor device that the electronic devices are formed on. The TEC device is affixed to the semiconductor device via metal contacts and, in response to being energized via TSVs that are connected to other metal contacts, attracts heat generated by the electronic devices.

Figure 6:
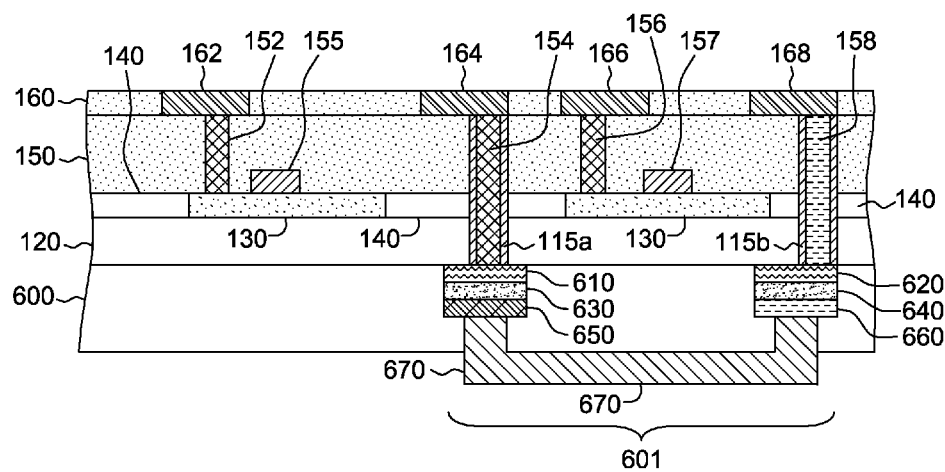
FIG. 6 depicts additional fabrication steps, in accordance with an embodiment of the present invention.

FIG. 6 illustrates an additional embodiment of the present invention. FIG. 6 depicts additional fabrication steps, in accordance with an embodiment of the present invention. Specifically, FIG. 6 illustrates an alternative embodiment wherein layer 200 is not formed on layer 110, which itself is completely removed during the wafer thinning step described in FIG. 1.

In an embodiment, bond pads 610 and 620, which include conductive material, are formed on layer 120 in the same fashion that bond pads 205 and 210 (discussed above) are formed on layer 200. In another embodiment, bond pads 610 and 620 are formed on layer 120 in the same fashion that metal contacts 510 and 515 are formed on layer 110. In yet another embodiment, metal contacts 610, 620, 205, and 210 include the same conductive material. In other embodiments, metal contacts 630 and 640 are formed on bond pads 610 and 620, respectively, in the same fashion that metal contacts 220 and 225 are formed on bond pads 205 and 210, respectively. In still other embodiments, metal contacts 630, 640, 320, and 325 include the same conductive material.

TEC elements 650 and 660 are formed on metal contacts 630 and 640, respectively, in the same fashion that TEC elements 230 and 235 are formed on metal contacts 220 and 225, respectively. In an embodiment, TEC elements 650 and 660 include the same TEC material as TEC devices 230 and 235, respectively. Layer 600, which includes insulator material, is formed on layer 120 in the same fashion that layer 300 is formed on layer 200. In an embodiment, layers 600 and 300 include the same material. Wire 670, which includes conducting material, is formed on layer 600 in the same fashion that wire 310 is formed on layer 300.

In an embodiment, wires 670 and 310 include the same conducting material. TEC device 601 functions in the same fashion as TEC device 340. The IC structure depicted in FIG. 6 illustrates a multi-layered semiconductor device that includes electronic devices formed on a side of the semiconductor device, in accordance with an embodiment of the present invention. Wherein the semiconductor device is cooled via a TEC device that is affixed to the opposite side of the semiconductor device that the electronic devices are formed on. The TEC device, which is embedded in insulator material, is affixed to the semiconductor device via metal contacts and, in response to being energized via TSVs that are connected to other metal contacts, attracts heat generated by the electronic devices.

Figure 7:
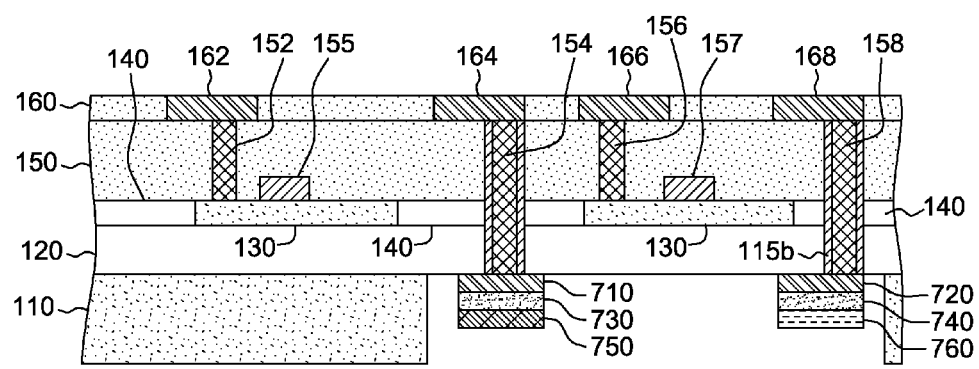
FIG. 7 depicts additional fabrication steps, in accordance with an embodiment of the present invention.

FIG. 7 depicts additional fabrication steps, in accordance with an embodiment of the present invention. Specifically, FIG. 7 describes additional fabrication steps that utilize the structure described in FIG. 1. A mask is formed on the non-TEC device areas of layer 110. Excess layer 110 is removed, for example, by lithography and etching. Bond pads 205 and 210, which include conducting material, are formed on layer 120 in the same fashion that bond pads 205 and 210 are formed on layer 120 (discussed above).

In an embodiment, metal contacts 710, 720, 205, and 210 include the same conducting material. Metal contacts 730 and 740, which include conducting material, are formed on bond pads 710 and 720, respectively, in the same fashion that metal contacts 220 and 225 are formed on bond pads 205 and 210, respectively.

In an embodiment, metal contacts 730, and 740 include the same conducting material as metal contacts 220 and 225, respectively. TEC elements 750 and 760, which include TEC material, are formed on metal contacts 730 and 740 in the same fashion that TEC elements 230 and 235 are formed on metal contacts 220 and 225, respectively. In an embodiment, TEC elements 750 and 760 include the same thermoelectric material as TEC elements 230 and 235, respectively.

Figure 8:
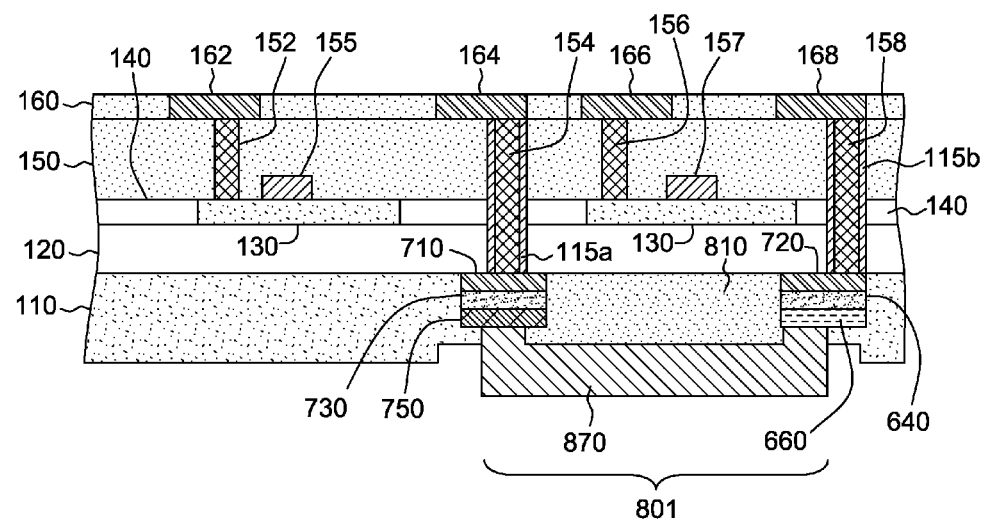
FIG. 8 depicts additional fabrication steps, in accordance with an embodiment of the present invention.

FIG. 8 depicts additional fabrication steps, in accordance with an embodiment of the present invention. Layer 810, which includes insulator material, is formed on layer 120 in the same fashion that layer 500 is formed on layer 200. Layers 810 and 500 include the same insulator material. Wire 870 is formed in layer 810 in the same fashion that wire 310 is formed in layer 300. FIG. 8 illustrates a multi-layered semiconductor device that includes electronic devices formed on a side of semiconductor device, in accordance with an embodiment of the present invention. Wherein the semiconductor device is cooled via a TEC device that is affixed to the opposite side of the semiconductor device that the electronic devices are formed on. The TEC device, which is embedded in insulator material, is affixed to the semiconductor device via solder bumps and, in response to being energized via TSVs that are connected to other metal contacts, attracts heat generated by the electronic devices.

Figure 9:
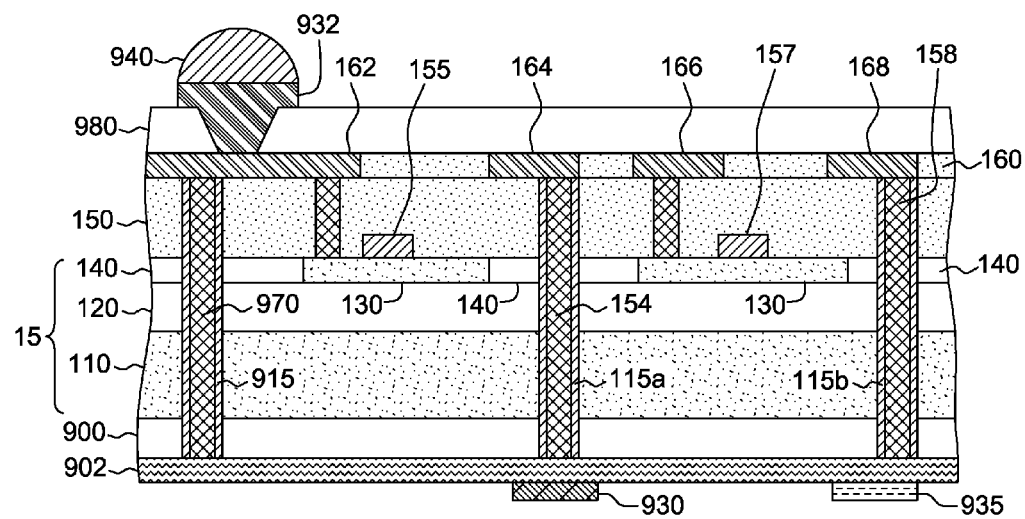
FIG. 9 depicts additional fabrication steps, in accordance with an embodiment of the present invention.

FIGS. 9 through 14 depict an embodiment of the present invention that is incorporated into a multi-chip stack. FIG. 9 depicts additional fabrication steps, in accordance with an embodiment of the present invention. Specifically, FIG. 9 describes additional fabrication steps that utilize the structure described in FIG. 1. Here, prior to the formation of layer 160 on layer 150, TSV 970 and barrier 915 are formed in layers 150, 140, 120, and 110 in addition to and in the same manner that TSVs 154 and 158 as well as barriers 115a and 115b are formed therein.

Layer 980, which includes insulator material, is formed on layer 160. In an embodiment, layer 980 is an insulation and/or passivation layer that includes insulation and/or passivation material, such as polymide. In certain embodiments, a mask is applied on the non-bond pad areas of layer 980. Bond pad 932, which includes a conducting material, is formed on layer 980. In an embodiment, bond pad 932 includes copper. Subsequently, the mask is removed. Contact 940, which includes a conducting metal, is formed on bond pad 930. In certain embodiments, contact 940 is a solder contact formed by solder reflow.

The wafer undergoes backside processing wherein layer 900 is formed on layer 110 in the same manner that layer 200 is formed on layer 110 (discussed above). Layer 902, which includes conducting material, is formed on layer 900. TEC elements 930 and 935, which include TEC material, are formed on layer 902 in the same fashion that TEC elements 230 and 235 are formed on metal contacts 220 and 225, respectively. TEC elements 930 and 935 function in the same fashion as TEC elements 230 and 235, respectively.

Figure 10:
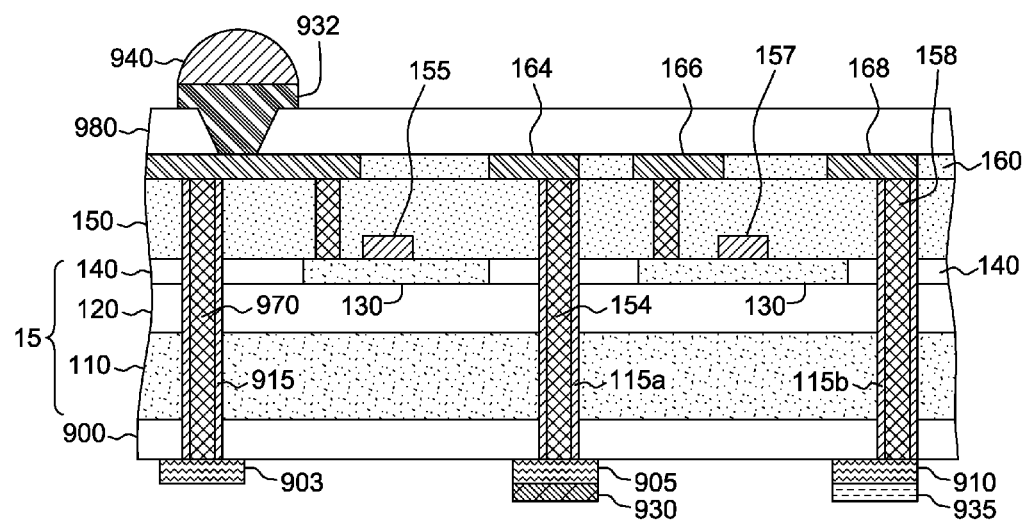
FIG. 10 depicts additional fabrication steps, in accordance with an embodiment of the present invention.
Figure 11:
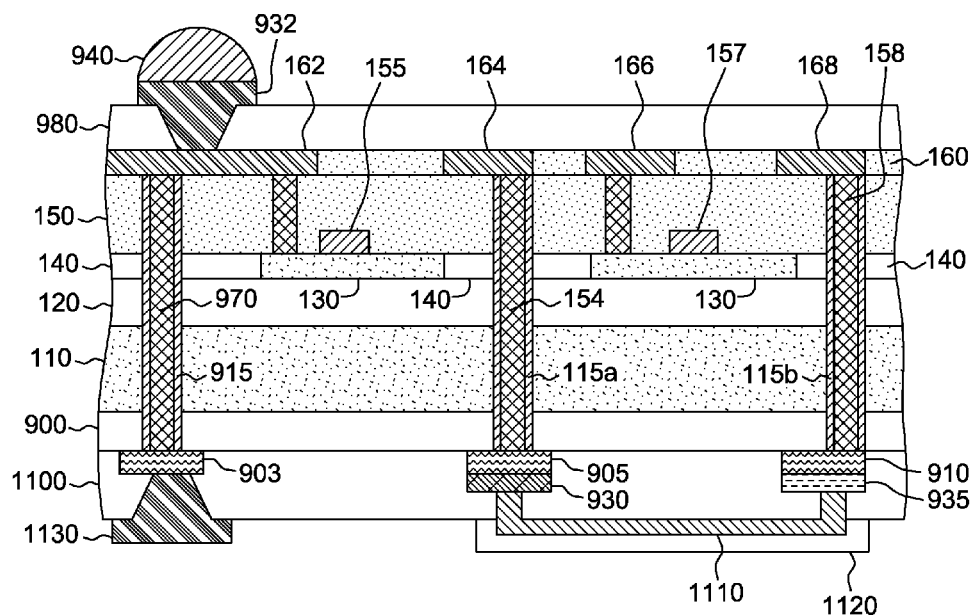
FIG. 11 depicts additional fabrication steps, in accordance with an embodiment of the present invention.

FIG. 10 depicts additional fabrication steps, in accordance with an embodiment of the present invention. Metal contacts 903, 905, and 910 are formed from layer 902 in the same fashion that metal contacts 510 and 515 are formed from layer 400 (discussed above). FIG. 11 depicts additional fabrication steps, in accordance with an embodiment of the present invention. Layer 1100, which includes dielectric material, is formed on layer 900. Bond pad 1130, which includes conducting material, is formed in layer 900 over metal contact 903 in the same fashion that bond pad 932 is formed in layer 980 over contact 162. In certain embodiment, bond pads 932 and 1130 include the same conducting material.

Figure 12:
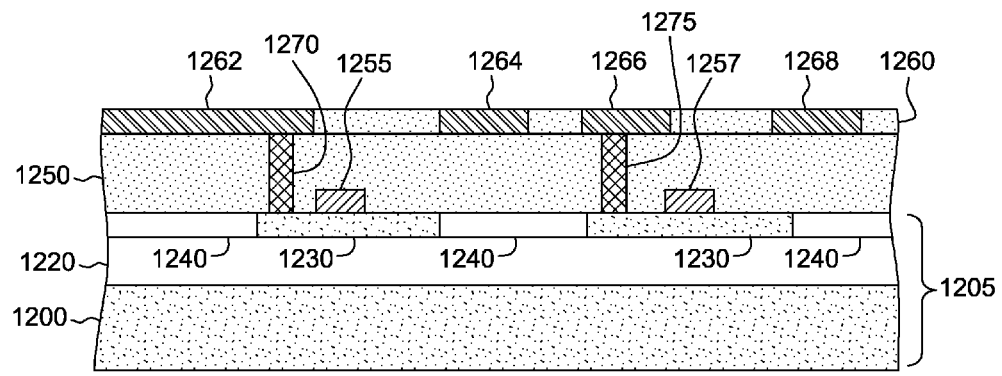
FIG. 12 depicts additional fabrication steps, in accordance with an embodiment of the present invention.

Wire 1110, which includes conducting material, is formed on TEC elements 930 and 935 in the same fashion that wire 310 is formed on TEC elements 230 and 235. Layer 1120, which includes dielectric material, is formed on wire 1110 and layer 1100. FIG. 12 depicts additional fabrication steps, in according to an embodiment of the present invention. Specifically, FIG. 12 illustrates fabrication steps for the second chip of a two chip stack embodiment of the present invention. In an embodiment, wafer 1205 is a SOI wafer that includes layers 1200, 1220, and 1230. Wafer 1205 is formed in the same fashion that wafer 105 is formed (discussed above). Layers 1200, 1220, and 1230 included the same dielectric material as layers 110, 120, and 130. Trenches 1240 are formed in layer 1230 in the same fashion and include the same dielectric material as trenches 140. Layer 1250 is formed on layer 1230 in the same fashion that layer 150 is formed on layer 130. Layers 1250 and 150 include the same dielectric material. TSVs 1270 and 1275 are formed in layer 1250 in the same fashion that TSV 152 and 156 are formed in layer 150. Devices 1255 and 1275 are formed in layer 1250 in the same fashion that devices 155 and 157 are formed in layer 150. In an embodiment, devices 1255, 1257, 155, and/or 157 are the same type of device, such as a FET. Layer 1260, which includes low-K dielectric material, is formed on layer 1250 in the same fashion that layer 160 is formed on layer 150. In certain embodiment, layers 1260 and 160 include the same low-K dielectric material.

Metal contacts 1262, 1264, 1266, and 1268, which include conducting material, are formed on layer 1260 in the same fashion that metal contacts 162, 164, 166, and 168 are formed on layer 160. In an embodiment, metal contacts 1262, 1264, 1266, 1268, 162, 164, 166, and/or 168 include the same conducting material.

Figure 13:
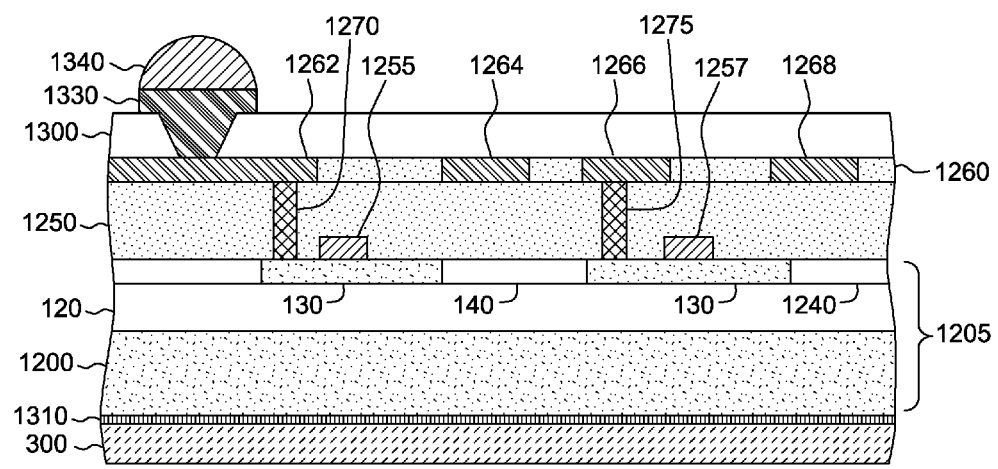
FIG. 13 depicts additional fabrication steps, in accordance with an embodiment of the present invention.

FIG. 13 depicts additional fabrication steps, in accordance with an embodiment of the present invention. The wafer undergoes additional front side processing wherein layer 1300, which includes insulator material, is formed on metal contacts 1262, 1264, 1266, 1268 and layer 1260 in the same fashion that layer 980 is formed on metal contacts 162, 164, 166, 168 and layer 160 (discussed above). Bond pad 1330, which includes conducting material, is formed on layer 1300 in the same fashion that bond pad 930 is formed in layer 980. Layer 1310, which includes thermal interface material (hereinafter "TIM"), is formed on layer 1200, for example, by screen printing or deposition by syringe. TIM may consist of silicon of epoxy binders impregnated with thermally conductive particles, such as silver ceramics and/or diamonds. Heat sink 1300, which is a metal heat sink, is affixed to layer 1200 by layer 1310. In an embodiment, heat sink 1300 includes one or more of the following metals: silicon, copper, aluminum, silver, gold, aluminum nitride, and diamond.

Figure 14:
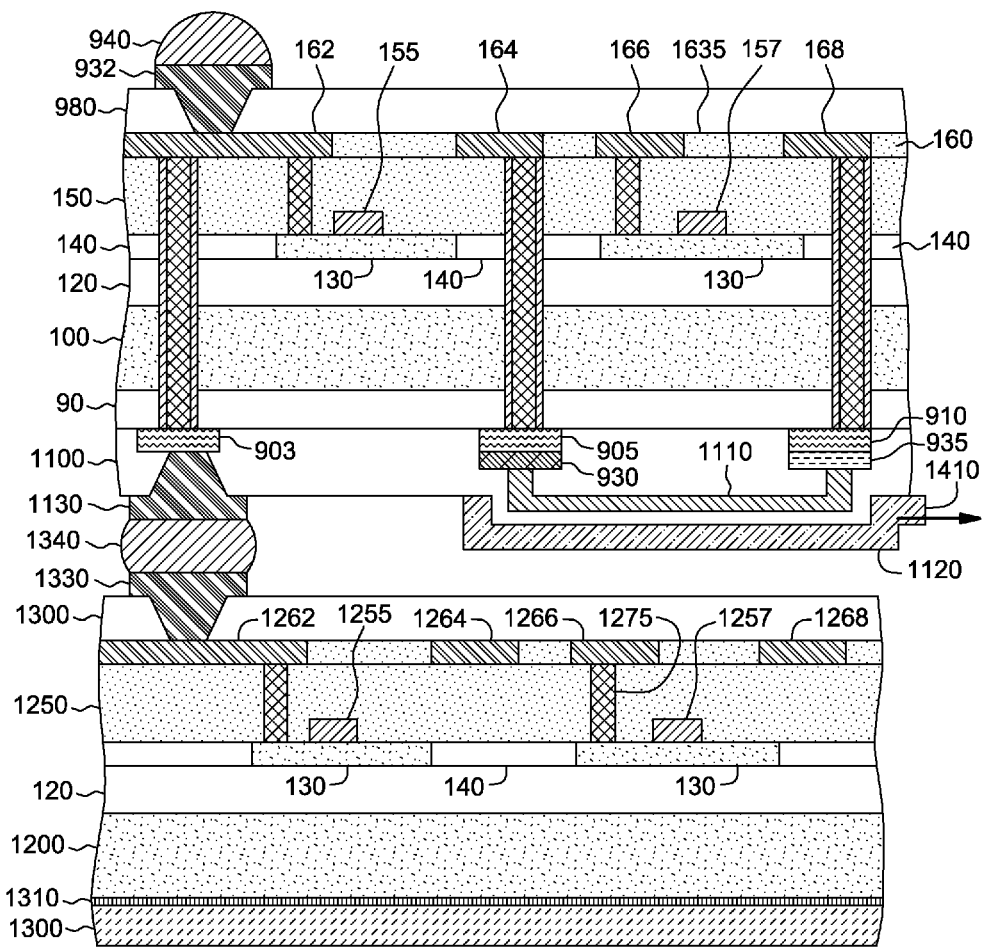
FIG. 14 depicts additional fabrication steps, in accordance with an embodiment of the present invention.

FIG. 14 depicts additional fabrication steps, in accordance with an embodiment of the present invention. Specifically, FIG. 14 depicts a chip stack that includes the semiconductor structures from FIGS. 11 and 13 affixed to each other. Heat sink 1410 is a heat sink that draws thermal energy from wire 1110. Heat sink 1410 includes heat sink material, such as copper, diamond, and/or composite materials, such as copper-titanium pseudo alloy, aluminum silicon carbide, Dymalloy, and E-material. In an embodiment, heat sink 1410 extends to the edge of the die.

FIG. 14 illustrates a multi-stacked multi-layered semiconductor device that includes electronic devices formed on a side of the first stack, in accordance with an embodiment of the present invention. Bond pads 1130 and 1330 are connected by metal contact 1340 (discussed above). In an embodiment, voids between the semiconductor devices are filled, for example, by epoxy injection. The semiconductor device depicted herein, which is formed on a SOI wafer, is cooled via a TEC device that is affixed to the opposite side of the semiconductor device that the electronic devices are formed on. The TEC device is affixed to the semiconductor device via metal contacts and, in response to being energized via TSVs that are connected to other metal contacts, attracts heat generated by the electronic devices. The second stack is attached to the first stack by a solder bump and includes a heat sink adhered to the side of the stack that is opposite if the solder bump.

Figure 15:
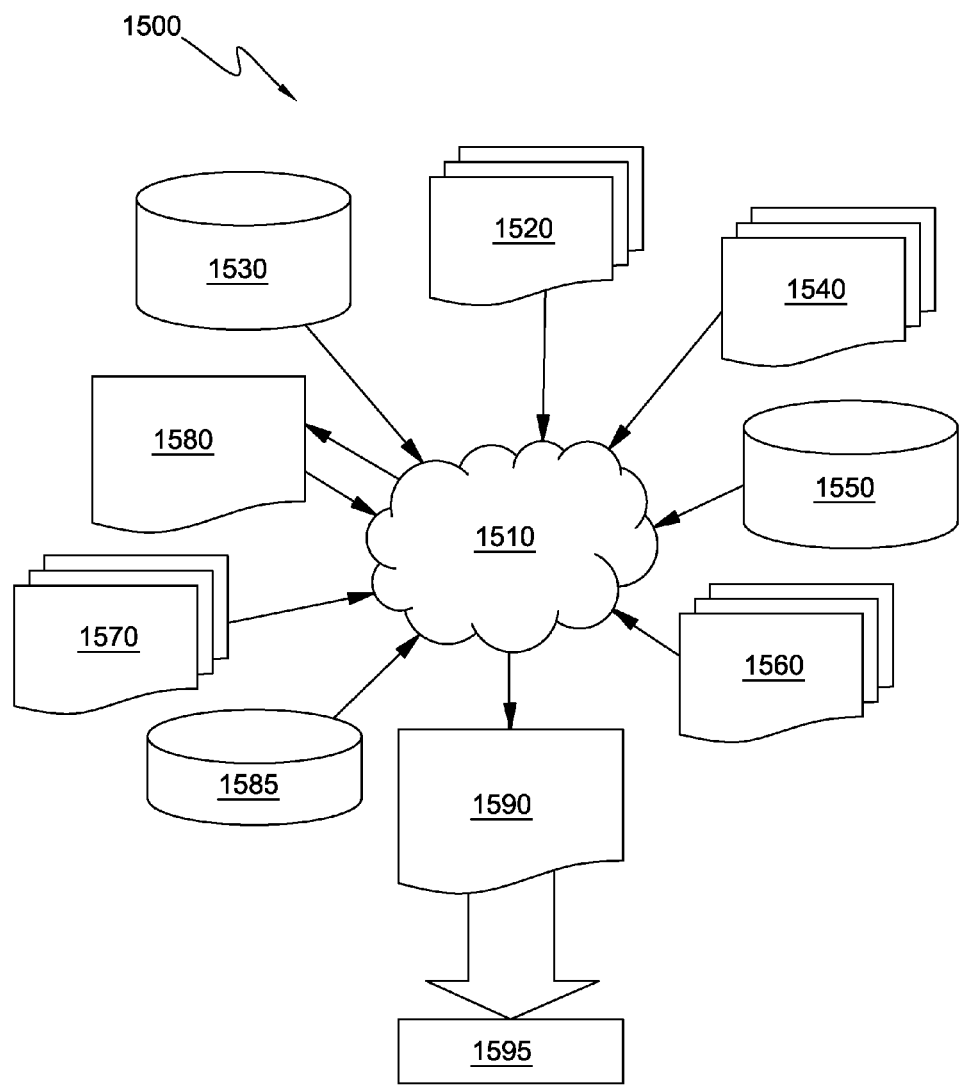
FIG. 15 is a flow chart of a design process used in semiconductor design, manufacture, and/or test.

FIG. 15 shows a block diagram of an exemplary design flow 1500 used for example, in semiconductor IC logic design, simulation, test, layout, and manufacture. Design flow 1500 includes processes, machines and/or mechanisms for processing design structures or devices to generate logically or otherwise functionally equivalent representations of the design structures and/or devices described above and shown in FIGS. 1-14. The design structures processed and/or generated by design flow 1500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array). Design flow 1500 may vary depending on the type of representation being designed. For example, a design flow 1500 for building an application specific IC (ASIC) may differ from a design flow 1500 for designing a standard component or from a design flow 1500 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 1520 that is preferably processed by a design process 1510. Design structure 1520 may be a logical simulation design structure generated and processed by design process 1510 to produce a logically equivalent functional representation of a hardware device. Design structure 1520 may also or alternatively comprise data and/or program instructions that when processed by design process 1510, generate a functional representation of the physical structure of a hardware device. Whether representing functional and/or structural design features, design structure 1520 may be generated using electronic computer-aided design (ECAD) such as implemented by a core developer/designer. When encoded on a machine-readable data transmission, gate array, or storage medium, design structure 1520 may be accessed and processed by one or more hardware and/or software modules within design process 1510 to simulate or otherwise functionally represent an electronic component, circuit, electronic or logic module, apparatus, device, or system such as those shown in FIGS. 1-14. As such, design structure 1520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1510 preferably employs and incorporates hardware and/or software modules for synthesizing, translating, or otherwise processing a design/simulation functional equivalent of the components, circuits, devices, or logic structures shown in FIGS. 1-15 to generate a Netlist 1580 which may contain design structures such as design structure 1520. Netlist 1580 may comprise, for example, compiled or otherwise processed data structures representing a list of wires, discrete components, logic gates, control circuits, I/O devices, models, etc. that describes the connections to other elements and circuits in an integrated circuit design. Netlist 1580 may be synthesized using an iterative process in which netlist 1580 is resynthesized one or more times depending on design specifications and parameters for the device. As with other design structure types described herein, netlist 1580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1510 may include hardware and software modules for processing a variety of input data structure types including Netlist 1580. Such data structure types may reside, for example, within library elements 1530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1540, characterization data 1550, verification data 1560, design rules 1570, and test data files 1585 which may include input test patterns, output test results, and other testing information. Design process 1510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1510 without deviating from the scope and spirit of the invention. Design process 1510 may also include modules for performing standard circuit design processes such as timing analysis, verification, design rule checking, place and route operations, etc.

Design process 1510 employs and incorporates logic and physical design tools such as HDL compilers and simulation model build tools to process design structure 1520 together with some or all of the depicted supporting data structures along with any additional mechanical design or data (if applicable), to generate a second design structure 1590. Design structure 1590 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1520, design structure 1590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-14. In one embodiment, design structure 1590 may comprise a compiled, executable HDL simulation model that functionally simulates the devices shown in FIGS. 1-14.

Design structure 1590 may also employ a data format used for the exchange of layout data of integrated circuits and/or symbolic data format (e.g. information stored in a GDSII (GDS2), GL1, OASIS, map files, or any other suitable format for storing such design data structures). Design structure 1590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-14. Design structure 1590 may then proceed to a stage 1595 where, for example, design structure 1590: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
    a buried dielectric layer including a first side and a second side opposite the first side;
    a first side portion located over the first side of the buried dielectric layer;
    a second side portion located over the second side of the buried oxide layer; and
    a thermoelectric cooling device;
    wherein:
    the first side portion includes integrated circuit type circuitry;
    the thermoelectric cooling device includes a first Peltier junction located in, and forming a part of, the second side portion; and
    the second side portion is at least substantially free of integrated circuit type circuitry.

2. The semiconductor structure of claim 1, wherein:
    the thermoelectric cooling device includes a plurality of Peltier junctions, including the first Peltier junction; and
    all Peltier junctions of the plurality of Peltier junctions are located in, and form part of, the second side portion.

3. The semiconductor structure of claim 2, wherein the thermoelectric cooling device includes two or more Peltier junctions that are connected by TiN/Al, aluminum, and/or Ti/Cu.

4. The semiconductor structure of claim 2, wherein:
    the thermoelectric cooling device further includes a plurality of through silicon vias and a plurality of contacts;
    the plurality of Peltier junctions is configured to be energized using the plurality of through silicon vias;
    the plurality of contacts are located in, and form a part of, the first side portion;
    the through silicon via extends from the plurality of Peltier junctions to the plurality of contacts.

5. The semiconductor structure of claim 2, wherein:
    the second side portion further includes polyimide or insulator material; and
    the plurality of Peltier junctions of the thermoelectric cooling device are formed in the polyimide or insulator material.

6. The semiconductor structure of claim 4, wherein:
    each contact of the plurality of contacts includes a bond pad and/or a metal contact formed in the second portion of the semiconductor structure in proximity to at least one silicon via of the plurality of silicon vias; and
    the Peltier junctions of the plurality of Peltier junctions are electrically coupled with one or more bond pad and/or metal contact.

7. The semiconductor structure of claim 1, wherein the second side portion further includes a heat sink located proximate to the first Peltier junction.

8. The semiconductor structure of claim 7, wherein the heat sink is affixed to the semiconductor structure using a thermal interface material.

9. The semiconductor structure of claim 1, wherein the second side portion is free of integrated circuit type components.

10. The semiconductor structure of claim 7, wherein the heat sink includes a low-k dielectric material and/or conducting material.

11. The semiconductor structure of claim 1, wherein the integrated circuit type circuitry of the first side portion includes a first field effect transistor.

12. The semiconductor structure of claim 1, wherein first Peltier junction the thermoelectric cooling device includes n-type and p-type semiconductor material.

13. A method for making a semiconductor structure on a buried dielectric layer including a first side and a second side opposite the first side, the method comprising:
forming a thermoelectric cooling device;
forming a first side portion located over the first side of the buried dielectric layer, with the first side portion including integrated circuit type circuitry; and
forming a second side portion located over the second side of the buried dielectric layer, with the second side portion with the second side portion being at least substantially free of integrated circuit type circuitry;
wherein the thermoelectric cooling device includes a first Peltier junction which is located in the second side portion.

14. The method of claim 13, wherein the thermoelectric cooling device is configured to be energized using a through silicon via that extends from the second side portion to the first side portion of the semiconductor structure.

15. A method of making a semiconductor structure, the method comprising:
providing a first semiconductor sub-structure including:
a buried dielectric layer including a first side and a second side opposite the first side,
a first side portion located over the first side of the buried dielectric layer,
a second side portion located over the second side of the buried oxide layer, and
a thermoelectric cooling device,
wherein:
the first side portion includes integrated circuit type circuitry,
the thermoelectric cooling device includes a plurality of Peltier junctions located in, and forming a part of, the second side portion, and
the second side portion is at least substantially free of integrated circuit type circuitry;
providing a second semiconductor sub-structure including integrated circuit type circuitry; and
attaching the first semiconductor sub-structure and the second semiconductor sub-structure to each other so that the second semiconductor sub-structure is attached to the second side portion of the first semiconductor sub-structure to form the semiconductor structure.

16. The method of claim 15 wherein:
the first semiconductor sub-structure includes a heat sink;
the heat sink is located to be proximate to at least some of the Peltier junctions, of the plurality of Peltier junctions, when the first and second semiconductor sub-structures are attached to each other.

17. The method of claim 15 wherein:
the first semiconductor sub-structure includes a heat sink;
the heat sink is located on a surface of the first semiconductor sub-structure which is an exterior surface before the first and second semiconductor sub-structures are attached to each other.

18. The method of claim 15 wherein the second side portion of first semiconductor sub-structure is free of integrated circuit type circuitry.

19. The semiconductor structure of claim 1 wherein the second side portion further includes a bonding structure suitable for bonding the semiconductor structure to a second semiconductor structure to form a chip stack.

20. The method of claim 13 wherein the second side portion further includes a bonding structure suitable for bonding the semiconductor structure to a second semiconductor structure to form a chip stack.

* * * * *